United States Patent
Alam et al.

(10) Patent No.: US 12,378,658 B1
(45) Date of Patent: *Aug. 5, 2025

(54) LOW PRESSURE CLOSED CHAMBER METHOD FOR FORMING CHROMIUM NITRIDE THIN FILM

(71) Applicant: KING FAHD UNIVERSITY OF PETROLEUM AND MINERALS, Dhahran (SA)

(72) Inventors: Khan Alam, Dhahran (SA); Muhammad Baseer Haider, Dhahran (SA); Khalil A. Ziq, Dhahran (SA); Bakhtiar Ul Haq, Dhahran (SA)

(73) Assignee: KING FAHD UNIVERSITY OF PETROLEUM AND MINERALS, Dhahran (SA)

( * ) Notice: Subject to any disclaimer, the term of this patent is extended or adjusted under 35 U.S.C. 154(b) by 0 days.

This patent is subject to a terminal disclaimer.

(21) Appl. No.: 19/185,035

(22) Filed: Apr. 21, 2025

Related U.S. Application Data

(63) Continuation of application No. 17/886,139, filed on Aug. 11, 2022, now Pat. No. 12,305,272.

(51) Int. Cl.
  *C23C 14/35* (2006.01)
  *C23C 14/06* (2006.01)

(52) U.S. Cl.
  CPC .......... *C23C 14/0676* (2013.01); *C23C 14/35* (2013.01)

(58) Field of Classification Search
  CPC .. C23C 14/0676; C23C 14/35; C23C 14/0036
  See application file for complete search history.

(56) References Cited

U.S. PATENT DOCUMENTS

2021/0189548 A1* 6/2021 Diechle ............... C23C 14/0036

FOREIGN PATENT DOCUMENTS

| CN | 111847900 A | | 10/2020 |
| CN | 112666789 A | | 4/2021 |
| CN | 114272965 A | | 4/2022 |
| JP | 2001110606 A | * | 4/2001 |
| JP | 4830198 B2 | * | 12/2011 |
| JP | 2011249791 A | * | 12/2011 |
| JP | 2019211229 A | * | 12/2019 |
| WO | 2012/147432 A1 | | 11/2012 |

OTHER PUBLICATIONS

JP-2019211229-A English translation. (Year: 2019).*
JP-4830198-B2 English translation. (Year: 2011).*
(Continued)

*Primary Examiner* — Hai Y Zhang
(74) *Attorney, Agent, or Firm* — Oblon, McClelland, Maier & Neustadt, L.L.P.

(57) ABSTRACT

A method for producing a chromium nitride (CrN) thin film is provided. The method includes reactive radio frequency magnetron sputtering chromium onto a substrate in the presence of a gaseous mixture including nitrogen and argon to form the CrN thin film, where a ratio of the nitrogen gas to the argon gas is 1:2 to 1:10, and where the CrN thin film has an average thickness of 500 to 1500 nm. The CrN film as prepared by the method of the present disclosure can be used in sensors for cryogenic temperature.

15 Claims, 15 Drawing Sheets

(56) References Cited

OTHER PUBLICATIONS

JP-2011249791-A English translation. (Year: 2011).*
JP-2001110606-A English translation. (Year: 2001).*
Cunha, et al. ; Si doped and un-doped CrN thin films produced by magnetron sputtering: structural and mechanical properties ; Journal of Nano Research vols. 18-19 ; pp. 201-211 ; 2012 ; 13 Pages.
Nouveau, et al. ; Stress and structure profiles for chromium nitride coatings deposited by r.f. magnetron sputtering ; Thin Solid Films 398-399 ; 2001 ; 6 Pages.
English translation. (Year: 2019).
English translation. (Year: 2011).

* cited by examiner

LOW PRESSURE CLOSED CHAMBER METHOD FOR FORMING CHROMIUM NITRIDE THIN FILM

CROSS-REFERENCE TO RELATED APPLICATIONS

The present application is a Continuation of U.S. application Ser. No. 17/886,139, now allowed, having a filing date of Aug. 11, 2022.

STATEMENT OF PRIOR DISCLOSURE BY AN INVENTOR

Aspects of the present disclosure are described in A. Khan; "Metal Nitride Thin Film Sensor for Cryogenic Temperatures"; Mar. 8, 2022; Ceramics International, incorporated herein by reference in its entirety.

BACKGROUND

Technical Field

The present disclosure is directed to metal nitride films, and more particularly to chromium nitride (CrN) thin films and a method of preparing the CrN thin films.

Description of Related Art

The "background" description herein generally presents the context of the disclosure. Work of the presently named inventors, to the extent it is described in this background section, as well as aspects of the description that may not otherwise qualify as prior art at the time of filing, are neither expressly nor impliedly admitted as prior art against the present invention.

Transition metal nitrides such as CrN, TiN, and TiAlVN are widely used for their tribological properties, corrosion resistance, magnetic, and electrical properties. Among other transition metal nitrides, CrN shows interesting electronic, and magnetic properties, and potential use for electronic/spintronic applications. Moreover, CrN is a model system for studying its coupled first-order electronic, magnetic, and structural transitions.

Bulk CrN samples have been analyzed, and their structural, electronic, and magnetic properties have been established. Bulk CrN is reported to be in a paramagnetic (PM) state with NaCl crystal structure at room temperature, and upon cooling, it makes a magneto-structural transition to an anti-ferromagnetic (aFM) state and orthorhombic crystal structure below its N'eel temperature (273-283 K) [A. Filippetti and N. A. Hill, Phys. Rev. Lett. 85, 5166 (2000), L. Corliss, N. Elliott, and J. Hastings, Phys. Rev. 117, 929 (1960), and A. Mrozi'nska, J. Przystawa, and J. S'olyom, Phys. Rev. B 19, 331 (1979)].

The structural, electronic, and magnetic transitions are linked, and one transition triggers another. Magneto-structural phase transition has been reported at 280 K from PM in NaCl crystal structure to aFM in orthorhombic/tetragonal crystal structure in CrN/MgO(001) thin films grown by molecular beam epitaxy (MBE) [K. Alam et al., Phys. Rev. B 96, 104433 (2017)]. However, the MBE technique is cost-intensive, and also requires a very low pressure of the order of $10^{-10}$ Torr, which is very challenging.

Accordingly, one object of the present invention is to develop CrN thin films for electronic phase transition as a function of CrN composition, by methods that overcome the above-stated limitations.

SUMMARY

In an exemplary embodiment, a method for producing a chromium nitride (CrN) thin film is described. The method includes reactive radio frequency magnetron sputtering chromium onto a substrate in the presence of a gaseous mixture comprising nitrogen and argon to form the chromium nitride thin film, where a ratio of the nitrogen gas to the argon gas is 1:2 to 1:10. The CrN thin films prepared by the method of the present disclosure has an average thickness of 500 to 1500 nanometers (nm).

In some embodiments, the reactive radio frequency magnetron sputtering is carried out in the presence of oxygen, and the chromium nitride thin film includes a $CrO_xN_y$ phase.

In some embodiments, the ratio of the nitrogen gas to the argon gas is 1:2 to 1:4.

In some embodiments, the chromium is sputtered with a sputtering power of 120-150 watts (W).

In some embodiments, the method further includes rotating the substrate during the reactive radio frequency magnetron sputtering.

In some embodiments, the chromium nitride thin film has a face-centered cubic (FCC) crystal structure.

In some embodiments, the chromium nitride thin film has an amorphous structure.

In some embodiments, a surface of the chromium nitride thin film has cracks having a width of 2 to 30 nm.

In some embodiments, the chromium nitride thin film has an average thickness of 600 to 1300 nm.

In some embodiments, the chromium nitride thin film has an average thickness of 1100 to 1300 nm.

In some embodiments, the chromium nitride thin film has an average thickness of 600 to 700 nm.

In some embodiments, the chromium nitride thin film has a band gap of −0.2 electron volts (eV) to 1.2 eV.

In some embodiments, the chromium nitride thin film has a resistivity at 20 to 30° C. of $1\times10^5$ ohm meter ($\Omega \cdot m$) to $5\times10^{-1}$ $\Omega \cdot m$.

In some embodiments, the chromium nitride thin film has a resistivity at 20 to 30° C. of 4 to $10\times10^{-5}$ $\Omega \cdot m$.

In some embodiments, the chromium nitride thin film has a resistivity at 20 to 30° C. of 1 to $5\times10^{-1}$ $\Omega \cdot m$.

In some embodiments, the chromium nitride thin film is crystalline and has a face-centered cubic structure.

In some embodiments, a surface of the chromium nitride thin film has pyramidal structures with the basal planes having either 60° or 90° corners.

In some embodiments, the chromium nitride film grows in [111]CrN, and [002]CrN directions by X-ray diffractogram (XRD).

In some embodiments, a chromium nitride thin film is described. The chromium nitride thin film is formed by the method of the present disclosure.

In some embodiments, a sensor for cryogenic temperature is described. The sensor includes the chromium nitride film. The chromium nitride thin film in the sensor is prepared by the method of the present disclosure.

The foregoing general description of the illustrative embodiments and the following detailed description thereof are merely exemplary aspects of the teachings of this disclosure and are not restrictive.

BRIEF DESCRIPTION OF THE DRAWINGS

A complete appreciation of this disclosure and many of the attendant advantages thereof will be readily obtained as the same becomes better understood by reference to the following detailed description when considered in connection with the accompanying drawings, wherein.

DETAILED DESCRIPTION

Figure 1A:
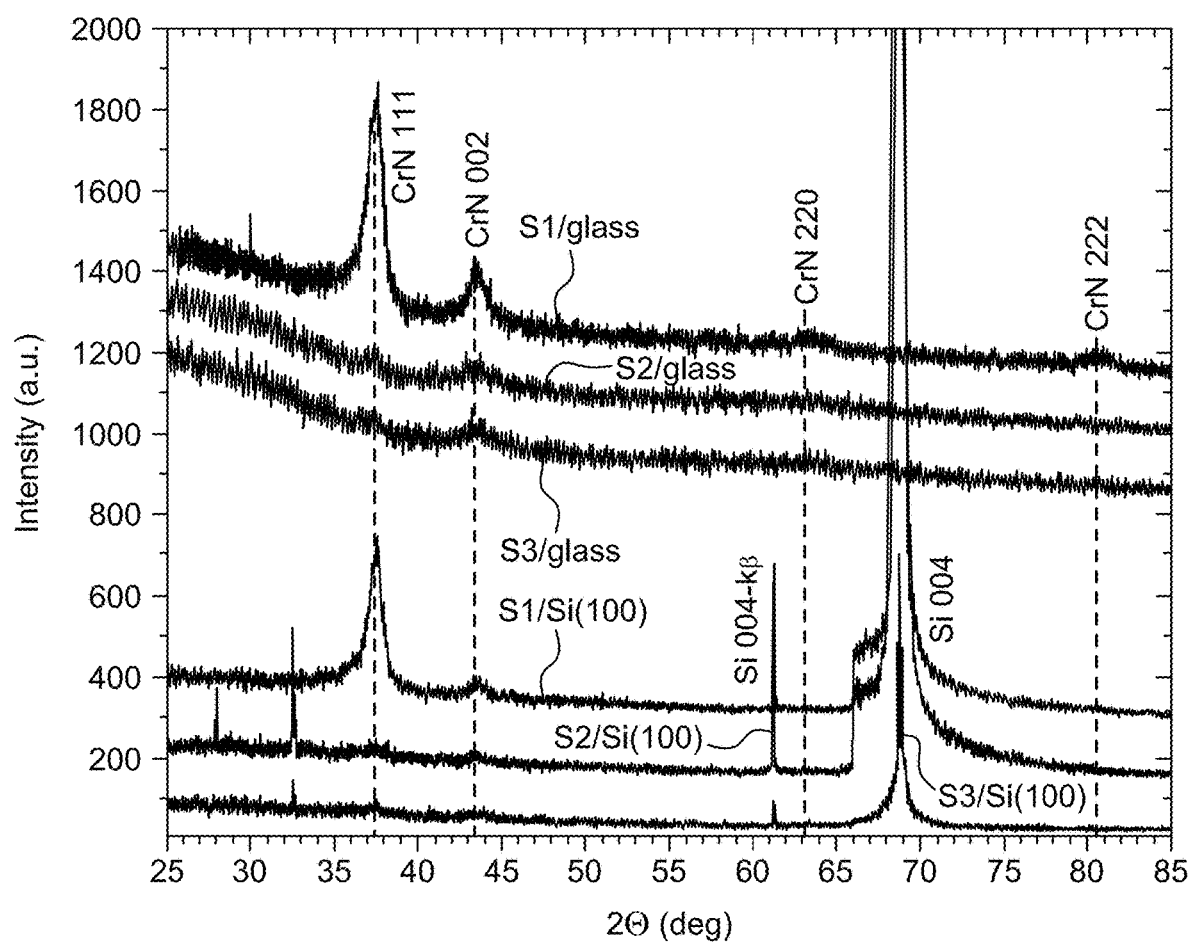
FIG. 1A shows an X-ray diffractogram (XRD) patterns of S1/glass, S2/glass, S3/glass, S1/Si(100), S2/Si(100), and S3/Si(100) CrN thin films, according to certain embodiments.

In the drawings, like reference numerals designate identical or corresponding parts throughout the several views. Further, as used herein, the words "a," "an" and the like generally carry a meaning of "one or more," unless stated otherwise.

Furthermore, the terms "approximately," "approximate," "about," and similar terms generally refer to ranges that include the identified value within a margin of 20%, 10%, or preferably 5%, and any values therebetween.

The term, "magnetron sputtering" herein refers to a high-rate vacuum coating technology that allows the deposition of many types of materials, including metals and ceramics, onto as many types of substrate materials by the use of a magnetic field applied to a sputtering target.

As used herein, the term "Ra" refers to an arithmetic average of the roughness profile.

As used herein, the term "substrate" refers to a single or multi-dimensional, natural or synthetic material or substance capable of supporting two-dimensional monolayer assemblies.

Aspects of the present disclosure are directed to chromium nitride (CrN) thin films, or "thin films" or "films" prepared by reactive radio frequency magnetron sputtering on glass and Si(001) substrates. The thin films are grown at different nitrogen to argon flow rate ratios, and their effect on the film composition, band gap, and electronic phase transition was studied by various experimental techniques. X-ray diffraction analyses establish that CrN films predominantly grow in [111]CrN and [002]CrN directions irrespective of the substrates used for the growths. The band gap was found to vary with the composition of the films. The resistance-temperature dependencies of these thin films are studied in the temperature range of 4 K to 320 K, and the results indicate that the films are semiconducting at room temperature. The films show discontinuity in their resistivity versus temperature curve, indicating an electronic transition. The low-temperature electronic phase can be controlled based on the growth conditions and composition of the films. The CrN thin films prepared by the method of the present disclosure can be used as a temperature sensor at cryogenic temperatures.

According to an aspect of the present disclosure, a method of preparing CrN thin films using a radio frequency (RF) magnetron sputtering method is described. Although the examples and the description herein provided refer to the preparation of the CrN thin films, it may be understood by a person skilled in the art that aspects of the present disclosure may be directed towards the preparation of other metal nitride thin films, apart from CrN thin films, such as vanadium nitride, tungsten nitride, etc., films as well. In some embodiments, the metal nitride may be a nitride of any metal from group VI(b) of the periodic table.

The method includes depositing chromium on a substrate by reactive RF magnetron sputtering, to form the CrN thin film. In some embodiments, the substrate is made of glass, for example, a flat glass slide. In some embodiments, the substrate is made up of stainless steel (SS), aluminum (Al), tin oxide, and copper (Cu). In some embodiments, the substrate maybe fluorine doped tin oxide (FTO) film, indium tin oxide (ITO) film, ITO coated polyethylene terephthalate (PET) film, a gold film, gold coated glass, aluminum oxide, titanium oxide, nickel oxide, tungsten oxide, and strontium titanate, and quartz. In some embodiments, the substrate is made of silica, for example, oxidized silicon wafers. The substrate may be of any desirable shape, such as, a circle, a triangle, a rectangle, a pentagon, a hexagon, an irregular polygon, a circle, an oval, an ellipse, or a multilobe. The substrate maybe rectangular in shape with a length and width of 0.5-5 cm, 1-4 cm, or 2-3 cm, respectively. The substrate may have an area in a range of 0.25-25 cm$^2$, preferably 0.5-5 cm$^2$, more preferably about 2 cm$^2$. Preferably the substrate is attached to an additional support, such as a glass slide.

The cleaning of the substrate may be done by UV irradiation, sonication, soaking, or scrubbing, and may use water, and/or an organic solvent. Water may be tap water, distilled water, bidistilled water, deionized water, deionized distilled water, reverse osmosis water, and/or some other water. In one embodiment, the water is bidistilled to eliminate trace metals. Preferably the water is bidistilled, deionized, deionized distilled, or reverse osmosis water and at 22-27° C. has a conductivity of less than 10 μS·cm$^{-1}$, preferably less than 1 μS·cm$^{-1}$, a resistivity greater than 0.1 MΩ·cm, preferably greater than 1 MΩ·cm, more preferably greater than 10 MΩ·cm, a total solid concentration less than 5 mg/kg, preferably less than 1 mg/kg, and a total organic carbon concentration less than 1000 μg/L, preferably less than 200 µg/L, more preferably less than 50 g/L. Organic solvent maybe methanol, ethanol, acetone, hexane, isopropanol, n-propanol, sec-butanol, n-butanol, isobutanol, tert-butanol, glycerol, diethyl ether, ethylene glycol, propylene glycol, polyethylene glycol, carbon tetrachloride, chloroform, or tetrachloroethylene. The cleaning may involve polishing without using a solution. In one embodiment, the substrate may be rinsed with acetone, and then rinsed with distilled water. The substrate maybe dried with a heat lamp, a flow of heated or unheated air or inert gas, an oven, a flame, freeze drying, or may be left to dry on its own.

In one embodiment, the thickness of the CrN thin film may vary from location to location on the substrate by 1-30%, 5-20%, or 8-10% relative to the average thickness of the CrN thin film. In a preferred embodiment, 70-100%, more preferably 80-99%, even more preferably 85-97% of the surface of the substrate is covered with the CrN thin film, though in some embodiments, less than 70% of the surface of the substrate is covered with the CrN thin film.

Further, the substrate may be held stationary or kept in rotation during the magnetron sputtering process. In one embodiment, the substrate is kept stationary during the magnetron sputtering process. In another embodiment, the substrate is kept rotating, for example, translational or rotational movement, during the magnetron sputtering process. In an embodiment, the substrate is kept rotating at 5-15 revolutions per minute (rpm), preferably 5-10 rpm, and more preferably 8 rpm for uniform film growth.

Further, the deposition of chromium onto the substrate is carried out in the presence of a gaseous mixture. The gaseous mixture includes nitrogen and argon. One of the critical components that affects the thickness of the films was the composition of nitrogen and argon in the gaseous mixture. The ratio of nitrogen to argon in the gaseous mixture may be altered to obtain a film with desired characteristics. At lower ratios of nitrogen to argon, the films had the highest thickness, whereas, at higher ratios, thin films were obtained. In an embodiment, the ratio of nitrogen to argon gas is 1:2 to 1:10, preferably 1:2 to 1:9, preferably 1:3, preferably 1: 2.25. In an embodiment, the ratio of the nitrogen gas to the argon gas is 1:2 to 1:4. In some embodiments, the gaseous mixture may contain some amount of oxygen. The films primarily include CrN, $Cr_2N$, and $Cr_2O_3$ phases; however, films formed in the presence of oxygen, include a $CrO_xN_y$ phase, wherein "x" is in the range of 1 to 3 and "y" is in the range of 1 to 3.

Yet another parameter that affects the film thickness in addition to substrate movement, and the composition of nitrogen and argon in the gaseous mixture is sputtering power. In some embodiments, the thickness of the films may be controlled by altering the sputtering power. In an embodiment, the chromium is sputtered with a sputtering power of 100-150 W, preferably 110-140 W, preferably 120-130 W, and more preferably 125 W.

The CrN thin films have an average thickness of 500 to 1500 nm, preferably 600 to 1400 nm, preferably 600 to 1300 nm. In some embodiments, the CrN thin film has 1100 to 1300 nm. In some embodiments, the CrN thin film has an average thickness of 600 to 700 nm.

The contacting and/or introducing may take place within a closed chamber or reactor.

In one embodiment, the closed chamber or reactor may have a length of 10-100 cm, preferably 12-30 cm, and a diameter or width of 1-10 cm, preferably 2-5 cm. In other embodiments, the closed chamber or reactor may have an interior volume of 0.2-100 L, preferably 0.3-25 L, more preferably 0.5-10 L.

In one embodiment, the closed chamber or reactor may comprise a cylindrical glass vessel, such as a glass tube.

Being in a closed chamber, the interior pressure of the chamber may be controlled. The pressure may be practically unlimited but need not be an underpressure or an overpressure.

In an embodiment, the chromium nitride thin film has a band gap of −0.2 eV to 2.0 eV, preferably −0.2 eV to 1.8 eV, preferably −0.2 eV to 1.2 eV. Further, the resistance-temperature dependencies of these thin films were studied in the temperature range of 4 K to 320 K, and the results reveal that the films were semiconducting at room temperature and showed discontinuity in their resistivity versus temperature curve, indicating an electronic transition. The CrN thin film has a resistivity at 20 to 30° C. of $1 \times 10^{-7}$ Ω·m to $10 \times 10^{-1}$ Ω·m, preferably $1 \times 10^{-6}$ Ω·m to $8 \times 10^{-1}$ Ω·m, preferably $1 \times 10^{-5}$ Ω·m to $5 \times 10^{-1}$ Ω·m. In some embodiments, the CrN thin film has a resistivity at 20 to 30° C. of 1 to $20 \times 10^{-1}$ Ω·m, preferably 1 to $10 \times 10^{-1}$ Ω·m, preferably 1 to $5 \times 10^{-1}$ Ω·m. In some embodiments, the CrN thin film has a resistivity at 20 to 30° C. of 1 to $20 \times 10^{-1}$ Ω·m, preferably 2 to $10 \times 10^{-1}$ Ω·m, preferably 4 to $5 \times 10^{-1}$ Ω·m.

The CrN thin film is preferably crystalline or partially crystalline with a face-centered cubic structure. In some embodiments, the CrN thin film has an amorphous structure. The surface of the CrN thin film has pyramidal structures, with the basal planes having either 50 to 70°, preferably 60° or 80 to 100°, preferably 90° corners.

In some embodiments, the surface of the CrN films has cracks having a width of 1 to 50 nm, preferably 1 to 40 nm, preferably 1 to 35 nm, preferably 2 to 30 nm. The surface of the CrN films may have cracks having a length of 1 to 2000 nm, preferably 1 to 1500 nm, preferably 1 to 1000 nm, preferably 1 to 800 nm, preferably 1 to 600 nm, preferably 1 to 500 nm, preferably 1 to 400 nm. The surface of the CrN films may have a surface roughness (Ra) of less than 10 nm, preferably less than 5 nm. The CrN film grows in [111]CrN, and [002]CrN directions by XRD.

In an embodiment, a sensor for cryogenic temperature comprises the chromium nitride film.

Examples

The following examples demonstrate exemplary embodiments of the CrN thin films for electronic phase transition. The examples are provided solely for illustration and are not to be construed as limitations of the present disclosure, as many variations thereof are possible without departing from the spirit and scope of the present disclosure.

Methods

CrN thin films were grown simultaneously on glass and Si(001) substrates by reactive RF magnetron sputtering of a 99.99% pure Cr target, argon (99.99% pure), and nitrogen (99.999% pure) ambient. Substrates were cleaned thoroughly with acetone followed by isopropyl alcohol (IPA) in a sonicator for about 5 minutes in each chemical to ensure high-quality growth.

The substrates were dried in the air before introducing them into the growth chamber. The growth was initiated after evacuating the sputtering chamber to $8.0 \times 10^{-6}$ Torr base pressure. Argon gas flow was kept constant at nine standard cubic centimeters per minute (sccm) for all the samples, whereas the nitrogen flow rate varied between 1 seem and 4 seem to grow the films with different nitrogen concentrations. For each film, the growth conditions were adjusted at the beginning of the growth and never changed afterward. All samples were grown at room temperature, and the chamber pressure during the growth was kept at 1.50-1.95×10⁻² Torr. An RF power sputtering gun sputtered the Cr target at a sputtering power of 125 W for 3 hours, and the substrate was kept rotating at 8 revolutions per minute (rpm) for uniform thin film growth. Growth conditions for the films are shown in Table 1. After the growth, the films were moved out of the growth chamber for ex-situ characterizations.

TABLE 1

Growth parameters and thickness of the CrN films simultaneously grown on Si(100) and glass substrates

| Sample | Ar flow (sscm) | N₂ flow (sscm) | $P_{GC}$ (Torr) | $t_{CrN}$ (nm) |
|---|---|---|---|---|
| S1 | 9 | 1 | 1.50 × 10⁻² | 1220 ± 5 |
| S2 | 9 | 3 | 1.65 × 10⁻² | 680 ± 5 |
| S3 | 9 | 4 | 1.95 × 10⁻² | 675 ± 5 |

X-ray diffraction (XRD) of the films was performed to determine lattice parameters, crystallinity, and growth orientation. Surface morphology and film thicknesses were studied using scanning electron microscopy (SEM) by TESCAN LYRA3. Transmittance spectra at normal incidence of the freshly grown films were obtained in an optical range from ultraviolet (UV) to infrared (IR) using a JASCO V-570 double-beam spectrophotometer. A study of elemental analysis and oxidation states of the elements of the film was carried out using X-ray photoelectron spectroscopy (XPS) by ThermoFisher Escalab 250Xi spectrometer. The XPS system was equipped with an Al-kα x-ray source and operated at an ultra-high vacuum with a base pressure of 3.0×10⁻¹⁰ Torr. The Thermo Scientific Avantage software is used for data analysis and peak fitting. The peaks were fitted with Gaussian and Lorentzian functions with iterated Shirley background subtraction. To complement the XRD and XPS results, Raman spectroscopy measurements were performed to determine the chemical composition of the films. The electronic properties of the films were studied using a variable temperature four-probe resistivity setup connected to a JANIS SHI-4T cryocooler. The setup can record resistance up to 2.0×10⁶ Ω in a temperature range from 325 K down to 4 K.

Results And Discussion

Characteristic Θ2Θ XRD patterns of CrN thin films grown on a glass substrate, S1/glass, S2/glass, S3/glass; and silicon substrate, Si(100), S1/Si(100), S2/Si(100), and S3/Si(100), are shown in FIG. 1A. The CrN thin films are produced simultaneously on glass and Si(100) substrates under the same growth conditions, and the XRD pattern of the films grown on both substrates (glass and Si(100)) is identical. The scans shown in FIG. 1A covers a range of 2Θ from 25° to 85°. The glass substrate was amorphous, so no peak was produced in the XRD pattern. Peaks produced by Si(100) are marked in the FIG. 1A. For the film S1, the 111, 002, 220, and 222 peaks of CrN appear at 2Θ=37.62°, 43.59°, 63.35°, and 80.80°, respectively. The appearance of these peaks indicates that the crystal structure was face-centered cubic (FCC) because the h, k, and l miller indices for each peak were either odd or even, and no peak had mixed odd and even indices. For films S2 and S3, the 111 and 002 peaks were observed, and their intensities were much smaller than the same peaks for film Si. The results indicate that increasing the N₂ flow rate and hence increasing the chamber pressure during the growth makes the films amorphous.

Figure 1B:
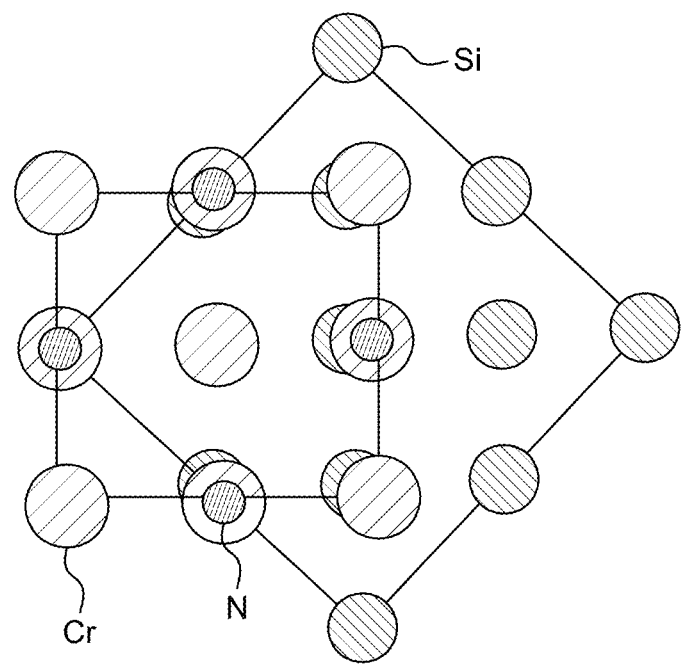
FIG. 1B shows a 2-dimensional (2D) view of CrN and Si crystal structures along [001]CrN, according to certain embodiments.
Figure 1C:
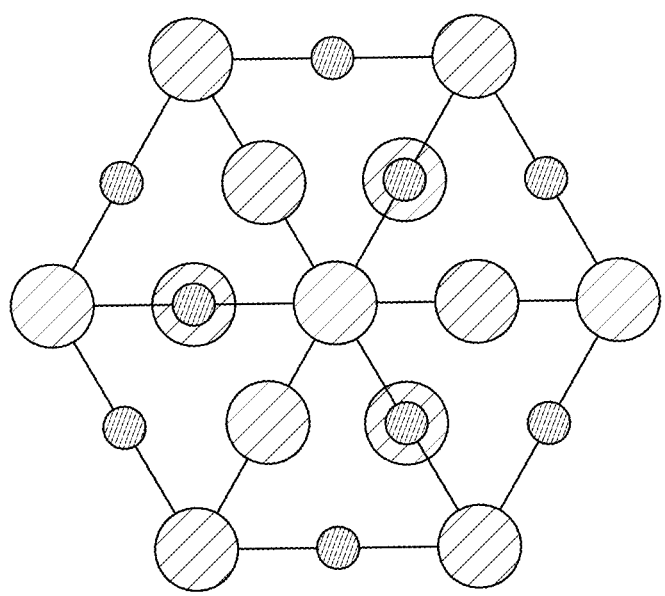
FIG. 1C shows a 2D view of the CrN crystal structure along [111]CrN, according to certain embodiments.

Using Bragg's equation, the CrN lattice constant for Si/glass was determined to be 4.14±0.01° A, which agreed with the reported value of 4.15° A [K. Alam et al., Phys. Rev. B 96, 104433 (2017); K. Alam et al., J. Phys. D Appl. Phys. 53, 125001 (2020); R. Ponce-P'erez, K. Alam, G. H. Cocoletzi, N. Takeuchi, and A. R. Smith, Appl. Surf. Sci. 454, 350 (2018); Y. Liu et al., Thin Solid Films 520, 90 (2011); K. Alam et al., J. Vac. Sci Technol. A 39, 063209 (2021)]. For the S2/glass, and the S3/glass, the 002 was more pronounced and shifted towards higher angles, indicating that the CrN lattice constant of these two films was smaller than that of S1. Silicon had a diamond crystal structure with a lattice constant of 5.43° A [P. Jariwala, Y. Sonavane, and P. Thakor, Mater. Today: Proc. 47, 559 (2021)], and CrN has an FCC crystal structure with a basis of Cr and N atoms and a lattice parameter of 4.14° A [J. Shi et al., Surf. Coat. Technol. 405, 126535 (2021)]. The CrN layer grown along [001] on Si(001) was under tensile compression because the lattice mismatch was about 7% as the CrN lattice parameter was 4.14° A and the distance Si atom at the corner position to the Si atom at the face-centered position was 3.89° A, as shown in FIG. 1B. The CrN layer grown along [111] on Si(001) was under tensile strain as the face diagonal of the Si crystal cell was 7.68° A, and the body diagonal of the CrN crystal cell was 7.18° A (FIG. 1C), which was also about a 7% mismatch.

Figure 2A:
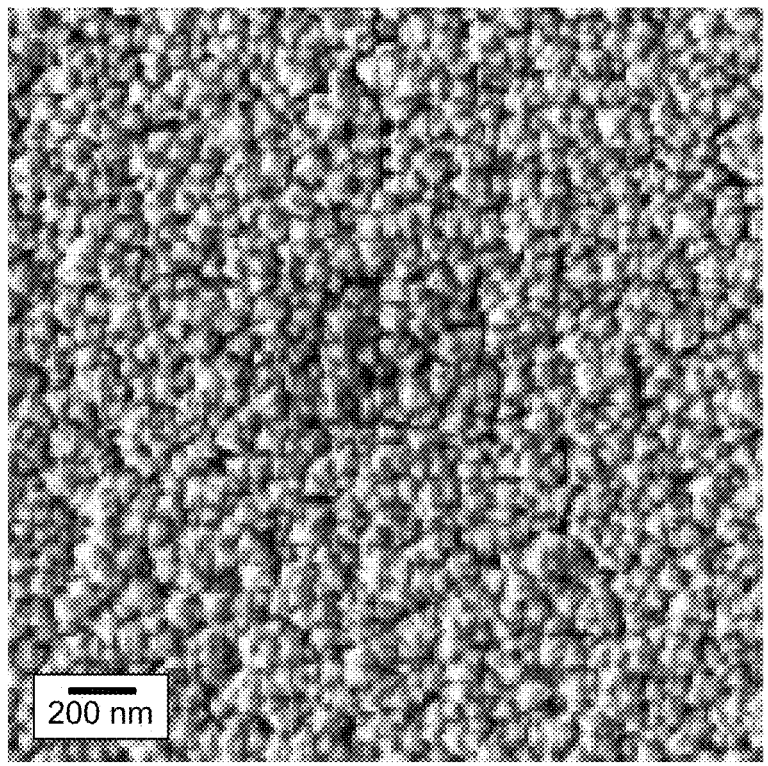
FIGS. 2A-2C show scanning electron microscope (SEM) images depicting a topographic view of the S1/Si(100), S2/Si(100), and S3/Si(100) CrN thin films, respectively, according to certain embodiments.
Figure 2B:
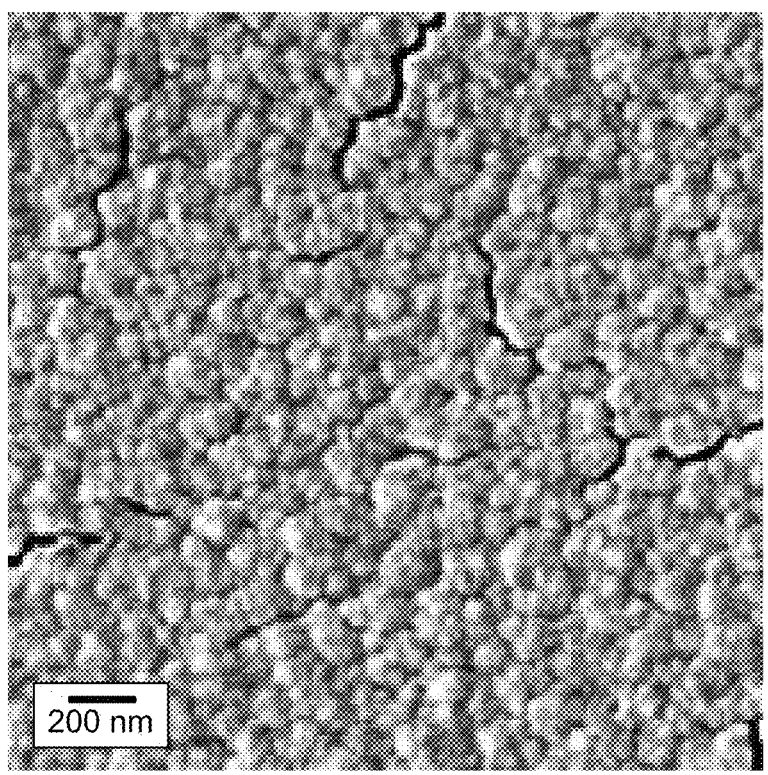
Figure 2C:
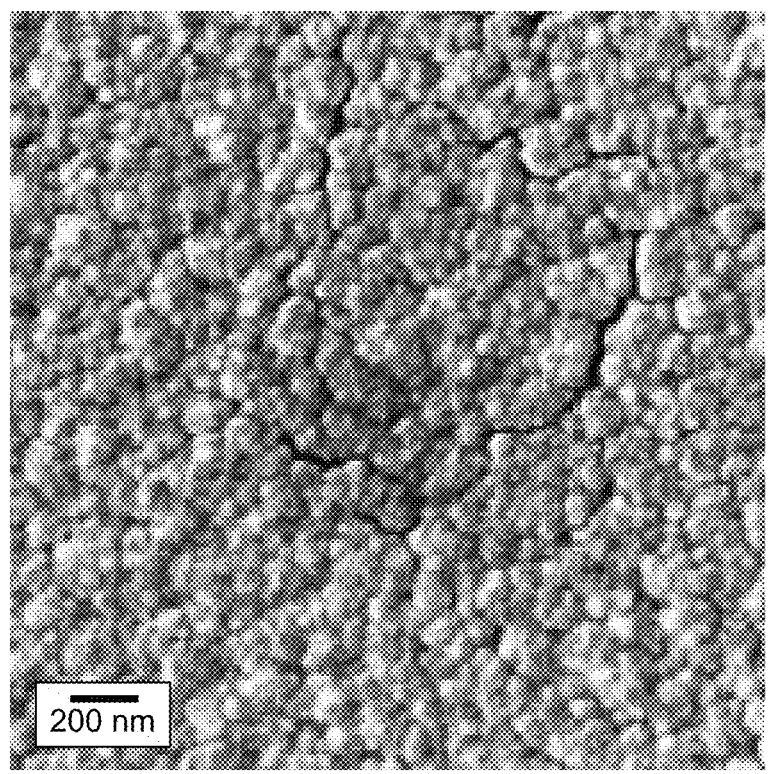

FIG. 2A shows SEM images of surface morphology and cross-sectional images of the films. The surface morphology of S1, S2, and S3 are shown in FIGS. 2A-2C, respectively. Topographic features on the surface of S1 have pyramidal structures, with the basal planes having sharp either 60° or 90° corners. The concentration of 60° corners was high, indicating that the growth direction was along [111]. The sharp features indicated that film S1 was crystalline, which confirmed the XRD results. Similar pyramidal structures with square basal planes were observed in the CrN thin films grown by molecular beam epitaxy on MgO(001) substrate [K. Alam et al., Phys. Rev. B 96, 104433 (2017)]. The results indicate that the shape of the pyramidal structures depended on the substrates on which the CrN films were grown.

FIGS. 2A-2C show SEM images depicting a topographic view of the S1/Si(100), S2/Si(100), and S3/Si(100) CrN thin films. The S1/Si(100), S2/Si(100), and S3/Si(100) may herein be referred to as S1, S2 and S3, respectively, in the FIGS. 2A-2F. The surfaces of S2 and S3 were smoother than the S1 surface, and the topographic protrudes do not have many sharp corners, indicating that S2 and S3 films were mostly amorphous. This agreed with the reduction of the peak intensity in the XRD patterns of S2 and S3 (FIG. 1A). Some cracks were also seen on the surfaces of the thin films. The cracks size and concentration on the S1 surface were smaller compared to S2 and S3; the size of the cracks on S2 and S3 surfaces were up to 25 nm wide. Aside from the cracks, no delamination or buckling was observed on any film. The cracks often occurred due to the brittleness of the films, which could be related to the film thickness and stoichiometry [S. Venkatachalam, Y. lida, and Y. Kanno, Superlattice Microst. 44, 127 (2008); and C. Parlikar, M. Z. Alam, D. Chatterjee, and D. K. Das, Mater. Sci. Eng. A 682, 518 (2017)].

Figure 2D:
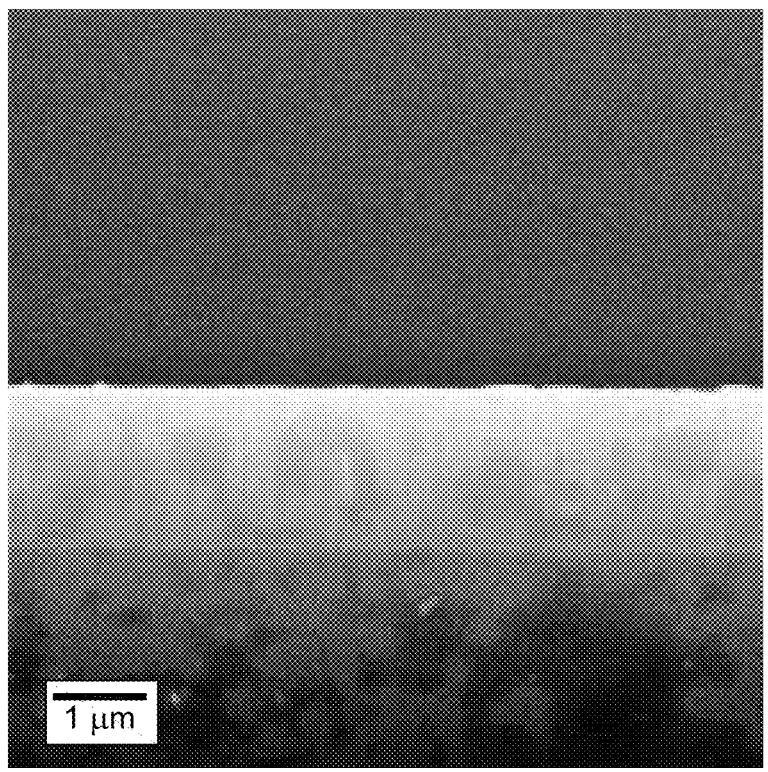
FIGS. 2D-2F show SEM images depicting a cross-sectional view of the S1/Si(100), S2/Si(100), and S3/Si(100) CrN thin films, respectively, according to certain embodiments.
Figure 2E:
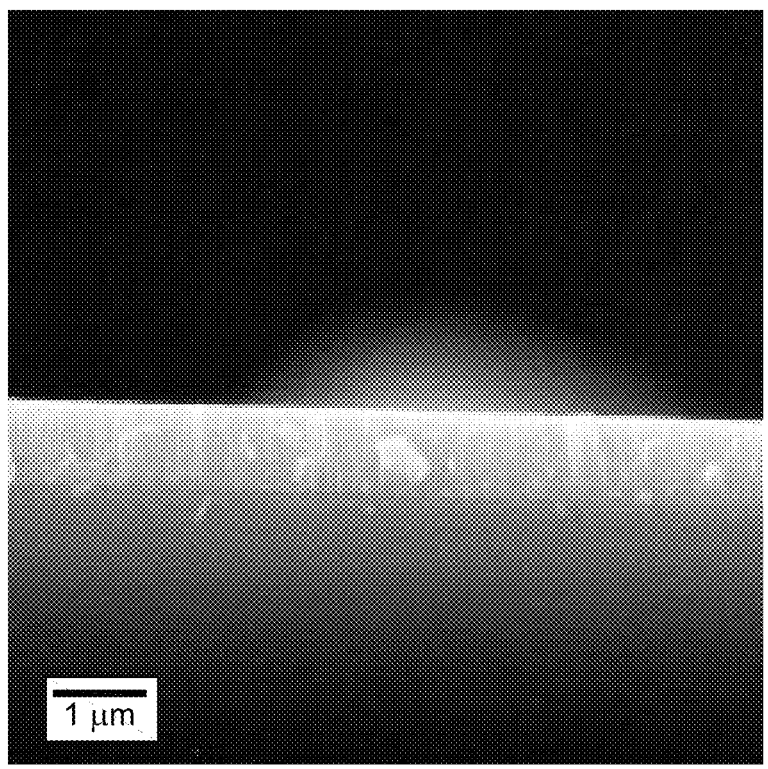
Figure 2F:
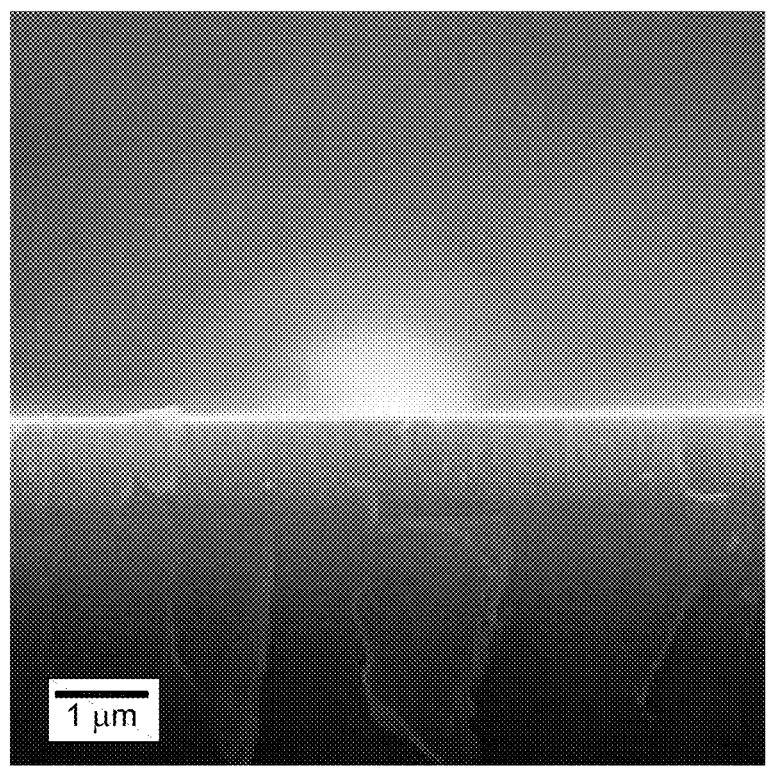

Cross-sectional images of S1, S2, and S3 were shown in FIGS. 2D-2F. These images of the freshly cleaved films were recorded with 20 kV high voltage and 50k magnification. The film and substrate parts were very well resolved. Using the calibrated scale of the SEM, film thickness for films S1, S2, and S3 were determined to be 1220 nm, 680 nm, and 675 nm thick, respectively. Considering the growth conditions, these thicknesses were in the expected range. It was further observed that the thickness of CrN thin films in the range of 37 nm to 980 nm had no significant effect on the structural and magnetic transitions. Since different theories and experiments suggest that the electronic, structural, and magnetic transitions of CrN thin films were coupled; therefore, it was assumed that these films' thickness should not affect the electronic transition. Although samples have been grown for the same time duration of 3 hours, it was observed that the film growth rate was inversely proportional to the nitrogen flow rate, in agreement with the literature. This drop in the growth rate in the reactive sputtering was either because the active gas formed a compound on the surface of the target or reduced the mean free path of the ions from the target to the substrate, which offsets the nitrogen incorporation and desorption rate of the film.

Figure 3:
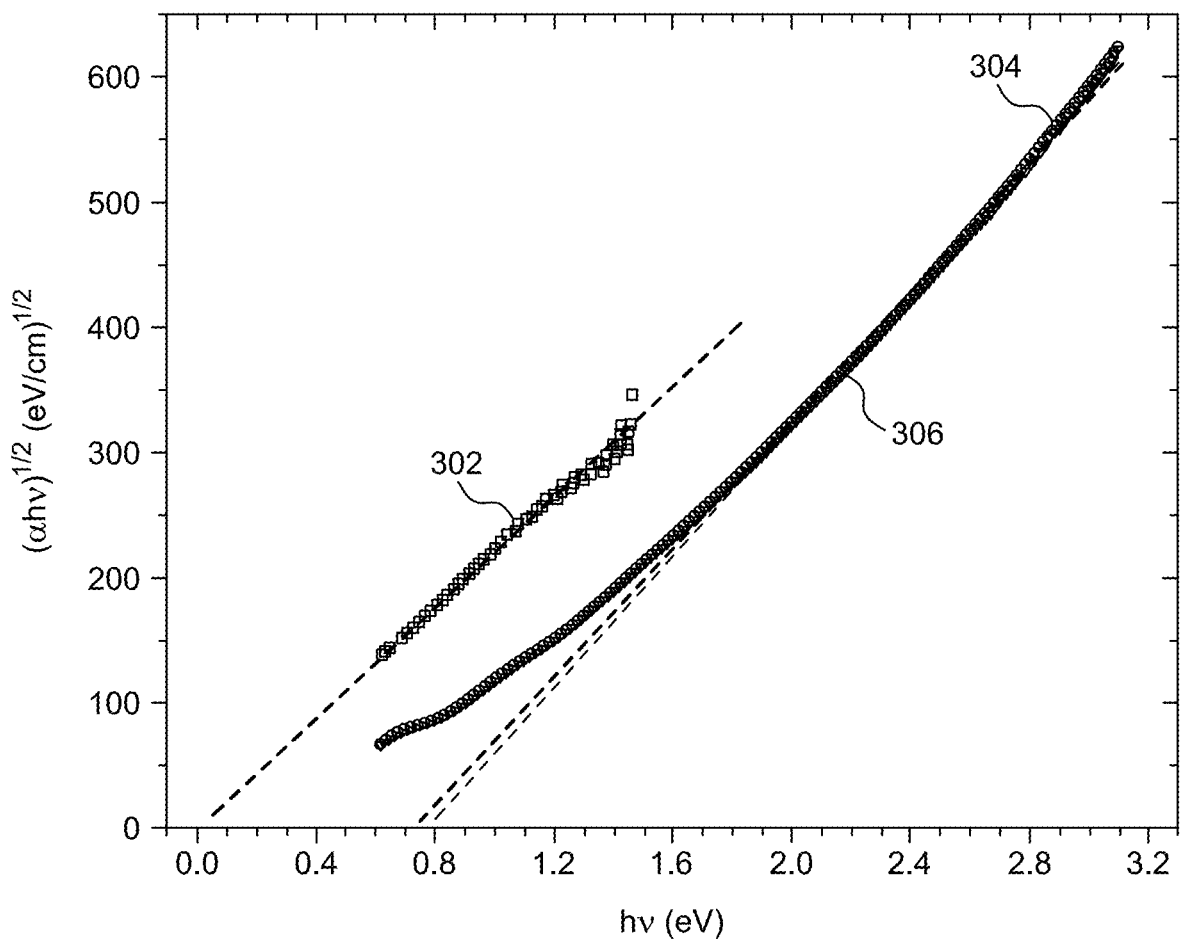
FIG. 3 is a Tauc's plot for the Si/glass, S2/glass, S3/glass CrN thin films, according to certain embodiments.

Normal incidence transmittance spectra of CrN/glass thin films were recorded to determine the band gap of the films. FIG. 3 is a Tauc's plot for the S1/glass, S2/glass, S3/glass CrN thin films. The S1/glass, S2/glass, S3/glass may herein be referred to as S1, S2 and S3, respectively, in the FIG. 3. The TAUC plot in FIG. 3 shows the $(\alpha E)^{1/2}$ versus the incident photon energy E=hv, where $\alpha$ is the absorption coefficient of CrN film and 'v' is the frequency of the photon. The absorption coefficient for a film of thickness 't' was determined from the optical transmission T data using $\alpha=1/t \ln(1/T)$. It is related to the energy band gap ($E_g$) by the following linear equation: $(\alpha E)^\beta = \gamma(E-E_g)$, where '$\beta$' has values of 2 and 1/2 for direct and indirect band gap transitions, respectively [M. B. Haider, M. Al-Kuhaili, S. Durrani, and I. Bakhtiari, J. Mater. Sci. Technol. 29, 752 (2013)], and '$\gamma$' is a constant. CrN is an indirect band gap semiconductor with a conduction band minimum at the Brillouin zone center Γ and a valence band maximum along Γ-K [X. Zhang and D. Gall, Phys. Rev. B 82, 045116 (2010)]. By applying a linear line fit to the linear sections of the curves in the TAUC plot, the band gap was found to be 0.02±0.1 eV, 0.75±0.1 eV, and 0.80±0.1 eV for S1 (302), S2 (304), and S3 (306) respectively (FIG. 3). The band gap of S1 was very small, and with the ±0.1 eV sigma, the conduction and valence bands may be overlapped. The band gaps of S2 and S3 agree with the reported band gap of 0.7 eV [D. Gall, C. Shin, R. Haasch, I. Petrov, and J. Greene, J. Appl. Phys. 91, 5882 (2002)], and 0.68 eV [T. Cheiwchanchamnangij and W. R. Lambrecht, Phys. Rev. B 101, 085103 (2020)].

Figure 4A:
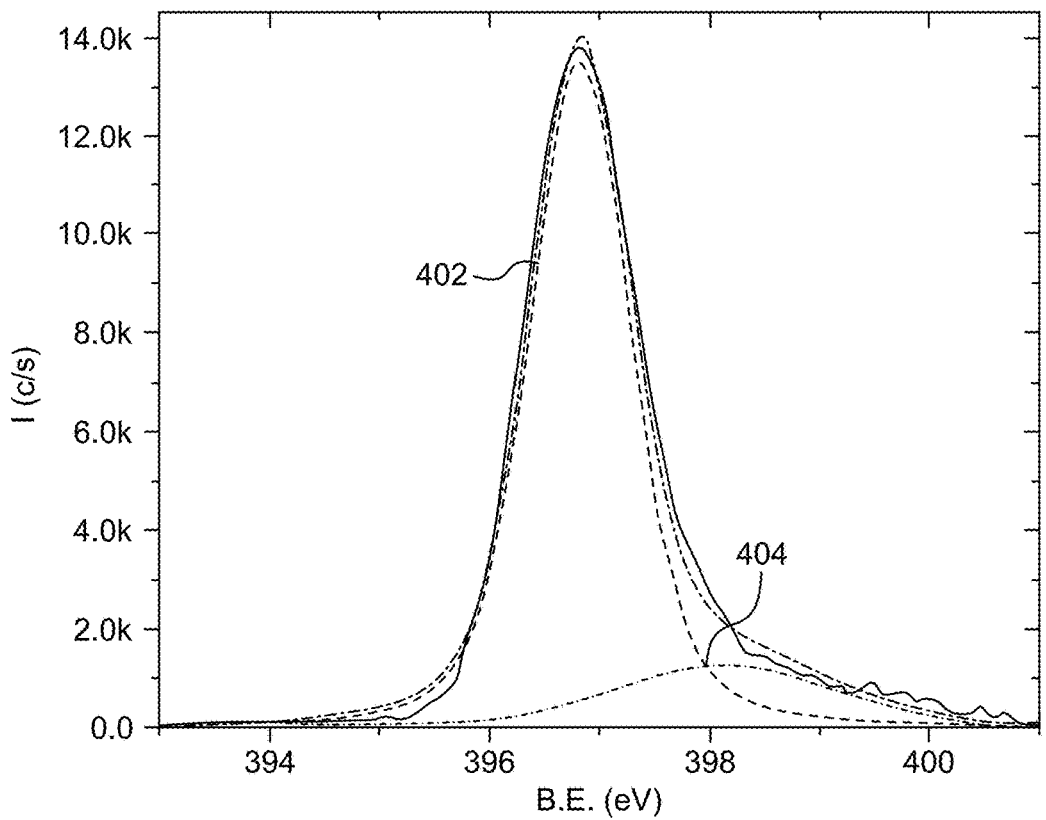
FIGS. 4A-4C show high-resolution X-ray photoelectron spectroscopy (XPS) spectra of N1 peak for the S1/Si(100), S2/Si(100), and S3/Si(100) CrN thin films, respectively, according to certain embodiments.
Figure 4B:
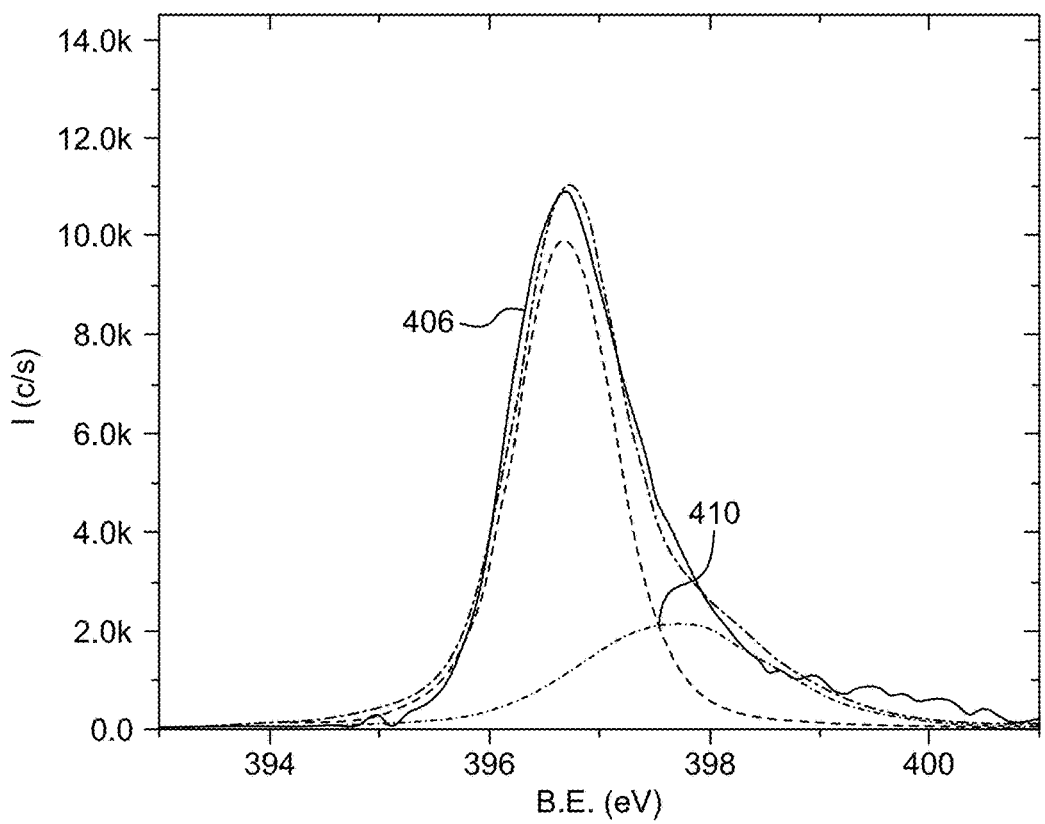
Figure 4C:
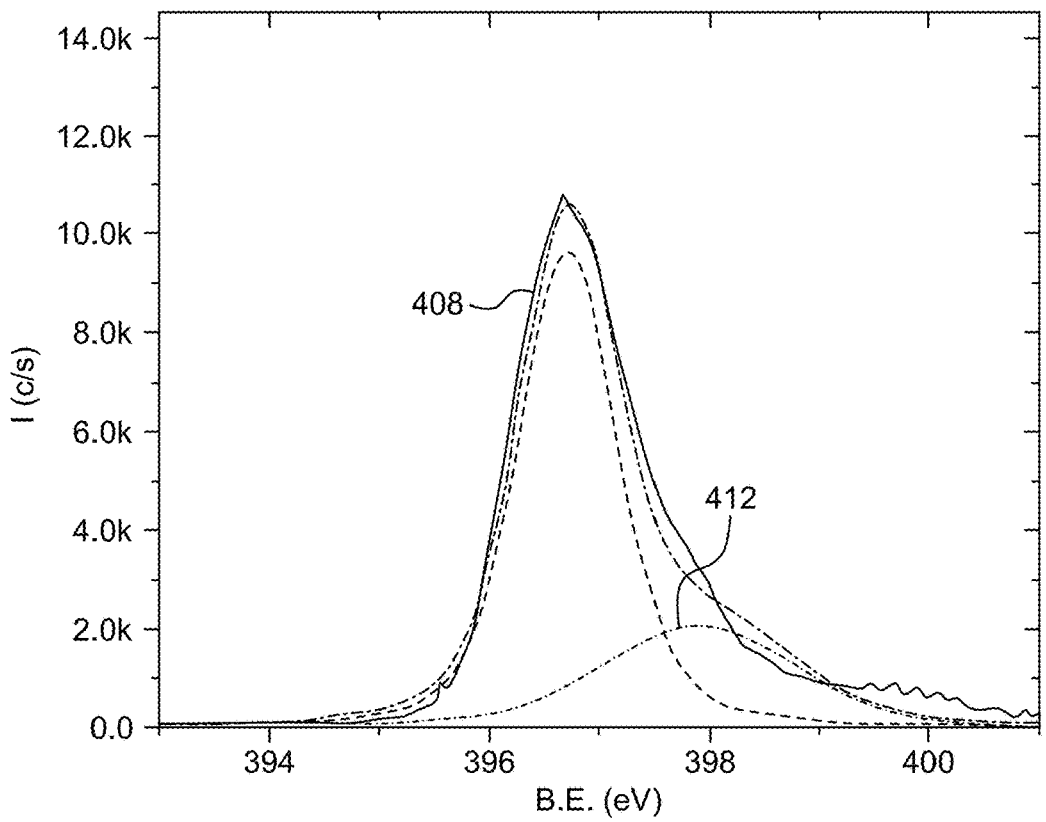

High-resolution XPS spectra of N1s for S1/Si(100), S2/Si(100), and S3/Si(100) CrN thin films, or herein referred to as S1, S2 and S3, respectively, are shown in FIGS. 4A-4C. Each peak position represents a compound's characteristic binding energy (B.E.). The N1s spectra were deconvoluted into two peaks. A major sharp peak in N1s spectra was centered around 396.8 eV (402), corresponding to CrN binding energy, whereas the second small peak is centered around 398 eV (404), corresponding to the binding energy of $CrO_xN_y$ (FIG. 4A) [A. Vyas, Z. Zhou, and Y. Shen, Effect of aluminum contents on sputter-deposited craln thin films, in IOP C. Ser-Mat. Sci., volume 307, page 012079, IOP Publishing, 2018; A. Lippitz and T. H"ubert, Surf. Coat. Tech. 200, 250 (2005)]. Similarly, N1s peaks of CrN for both S2 and S3 were observed at 396.7 eV (406 and 408), as can be observed in FIG. 4B. The N1s peaks of $CrO_xN_y$ for S2 and S3 were observed at 397.7 eV (410) and 397.9 eV (412), respectively (FIG. 4C). The binding energies corresponding to the observed peaks in the XPS spectra are provided in Table 2.

TABLE 2

Peak positions of all XPS spectra

| Sample | Cr $2p_{3/2}$ B.E. (eV) | | | Cr$2p_{1/2}$ B.E. (eV) | | | N1s B.E. (eV) | | O1s B.E. (eV) | |
|---|---|---|---|---|---|---|---|---|---|---|
| CrN/Si(100) | $Cr_2N$ | CrN | $Cr_2O_3$ | $Cr_2N$ | CrN | $Cr_2O_3$ | CrN | CrOxNy | $Cr_2O_3$ | O—H |
| S1 | 574.7 | 575.8 | 577.2 | 584.1 | 585.2 | 586.9 | 396.8 | 398.1 | 529.6 | 531.6 |
| S2 | 574.8 | 575.9 | 577.4 | 584.1 | 585.4 | 587 | 396.7 | 397.7 | 529.8 | 531.5 |
| S3 | 574.8 | 575.9 | 577.4 | 584.2 | 585.4 | 587 | 396.7 | 397.9 | 529.8 | 531.5 |

The intensity of N1s of CrN peak for film S1 was higher than its intensity for films S2 and S3, whereas the intensity of N1s of $CrO_xN_y$ peak for S1 was smaller than the corresponding peaks for S2 and S3, indicating a higher concentration of $CrO_xN_y$ in S2 and S3 compared to S1. Oxygen was not intentionally added to the system during the growth but may have chemisorbed on the films during air exposure before the XPS study.

Figure 4D:
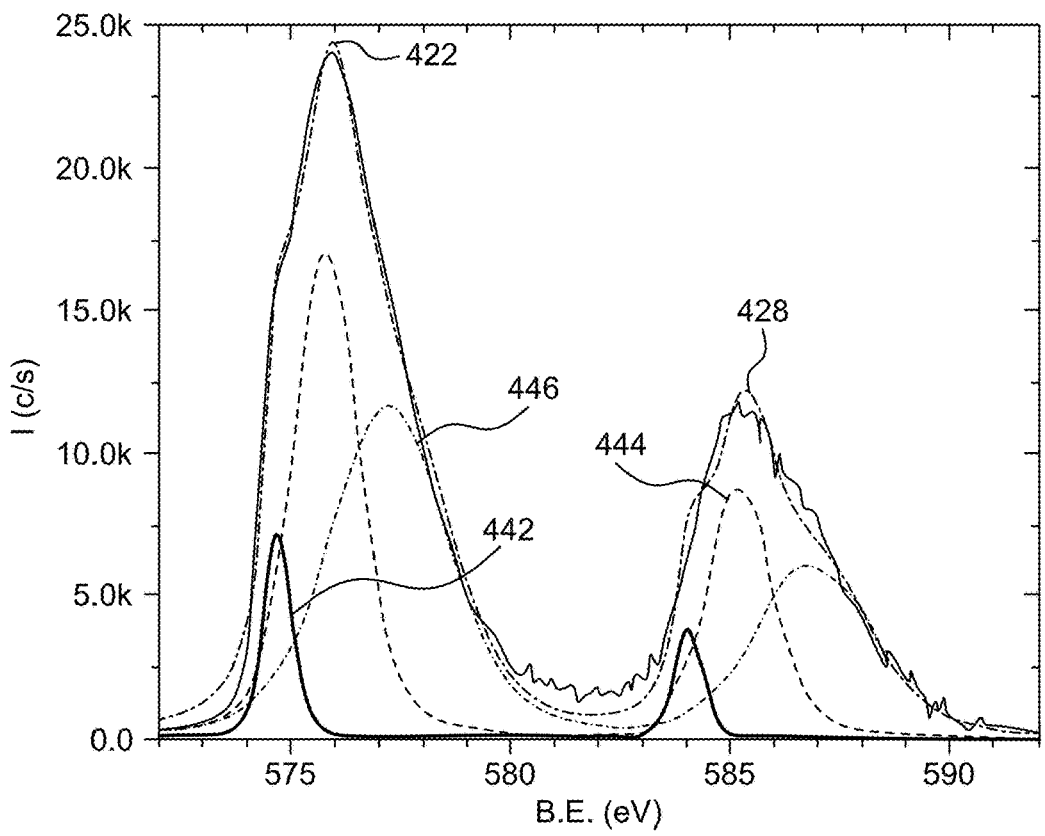
FIGS. 4D-4F show Cr2p spectra for the S1/Si(100), S2/Si(100), and S3/Si(100) CrN thin films, respectively, according to certain embodiments.
Figure 4E:
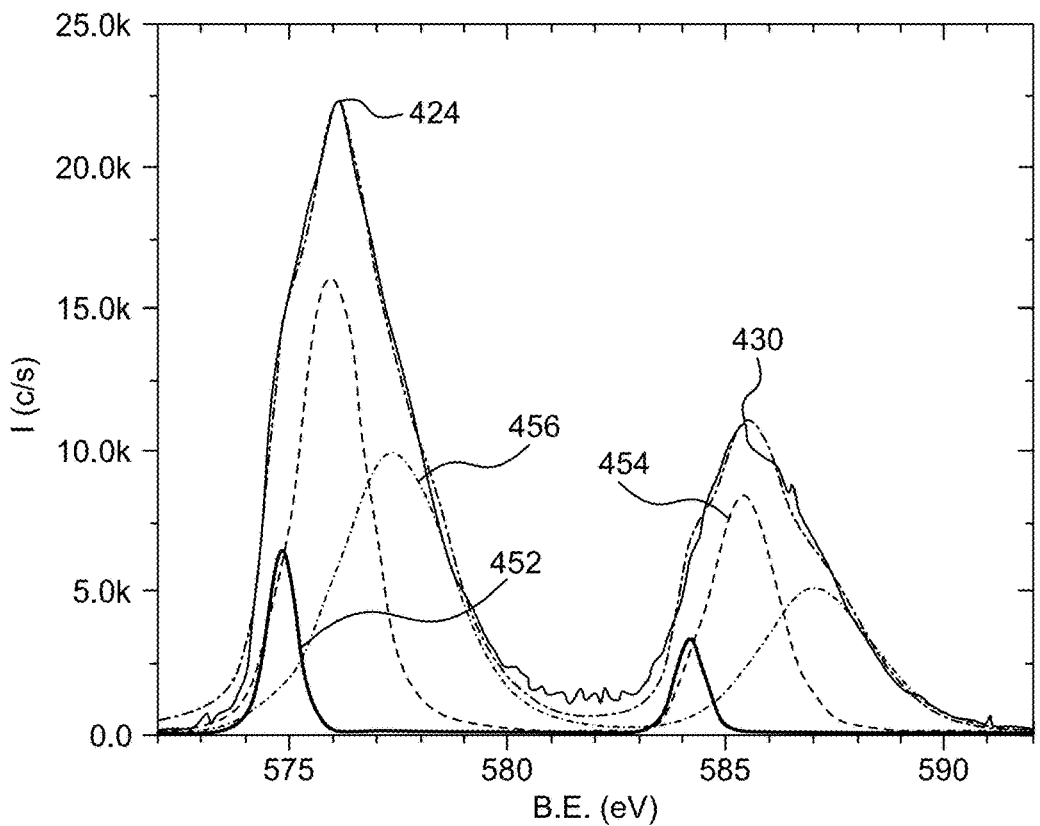
Figure 4F:
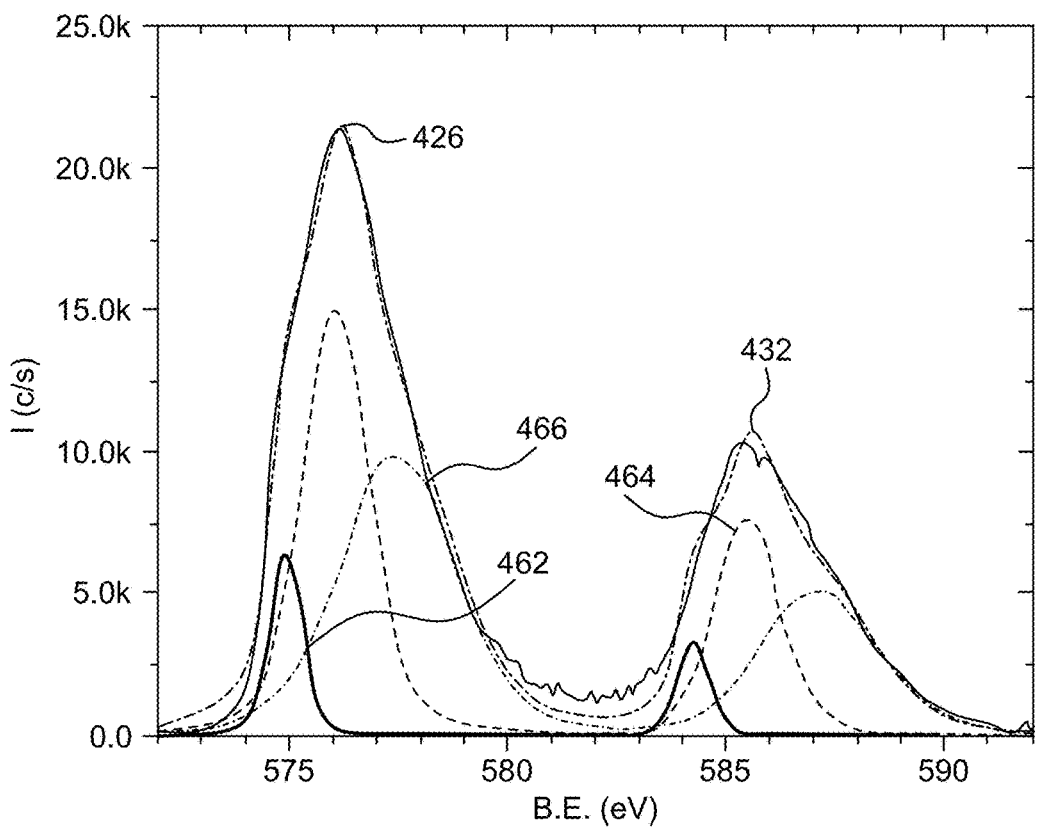

FIGS. 4D-4F show the high-resolution XPS spectra of Cr2p for S1, S2, and S3. Due to spin-orbit coupling, the Cr2p spectrum was split into two peaks, $Cr2p_{3/2}$ (422, 424, and 426) and $Cr2pv_2$ (428, 430, and 432), as can be observed in FIGS. 4D-4F, for S1, S2, and S3, respectively. By peak fitting analysis, both $Cr2p_{3/2}$ and $Cr2p_{1/2}$ peaks were further deconvoluted into three peaks corresponding to $Cr_2N$, CrN, and $Cr_2O_3$, which indicates that chromium was found in either +2 or +3 oxidation states. The absence of any $Cr2p_{3/2}$ peak at 574.3 eV suggests that all three samples are free of metallic chromium, so chromium was bonded with other elements. On comparing the peak intensity and the peak area, it was clear that most chromium was in a +3-oxidation state forming CrN or $Cr_2O_3$. The $Cr2p_{3/2}$ peaks at binding energies of 574.7±0.1 eV (442, 452 and 462), 575.8±0.1 eV (444, 454, and 464), and 577.3±0.1 eV (446, 456, and 466) were assigned to $Cr_2N$, CrN, and $Cr_2O3$, for S1, S2, and S3, respectively.

Figure 4G:
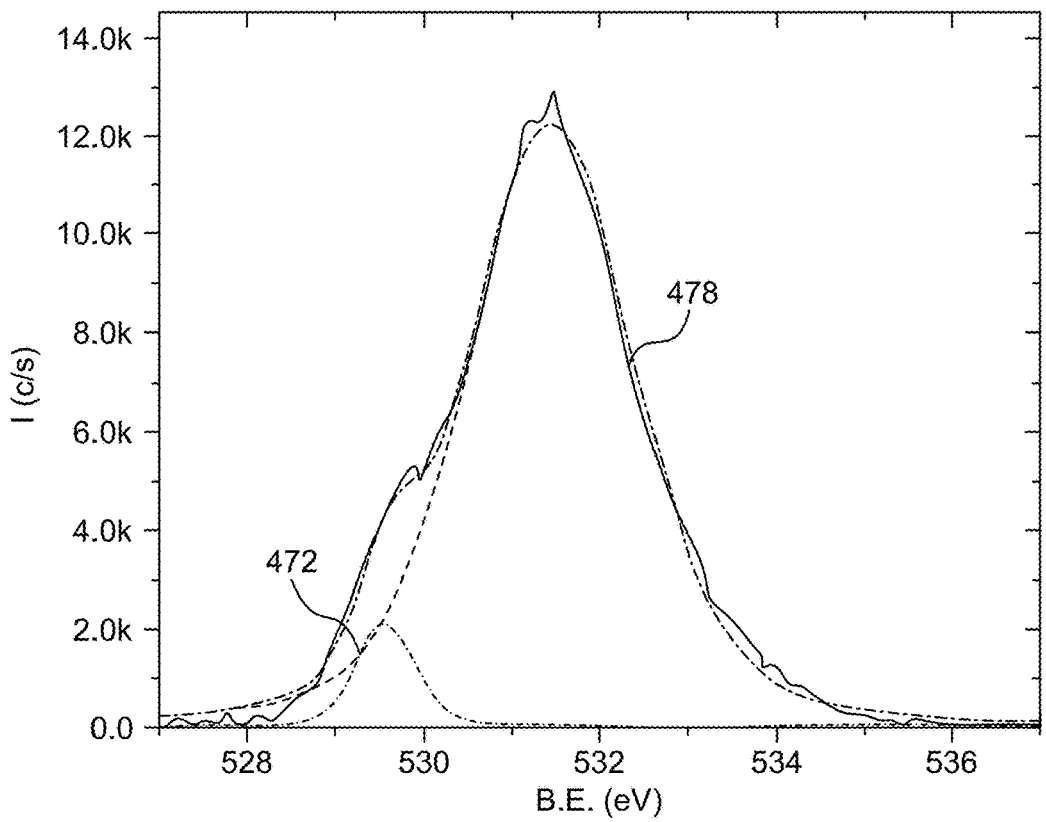
FIGS. 4G-4I show O1s peak for the S1/Si(100), S2/Si(100), and S3/Si(100) CrN thin films, respectively, according to certain embodiments.
Figure 4H:
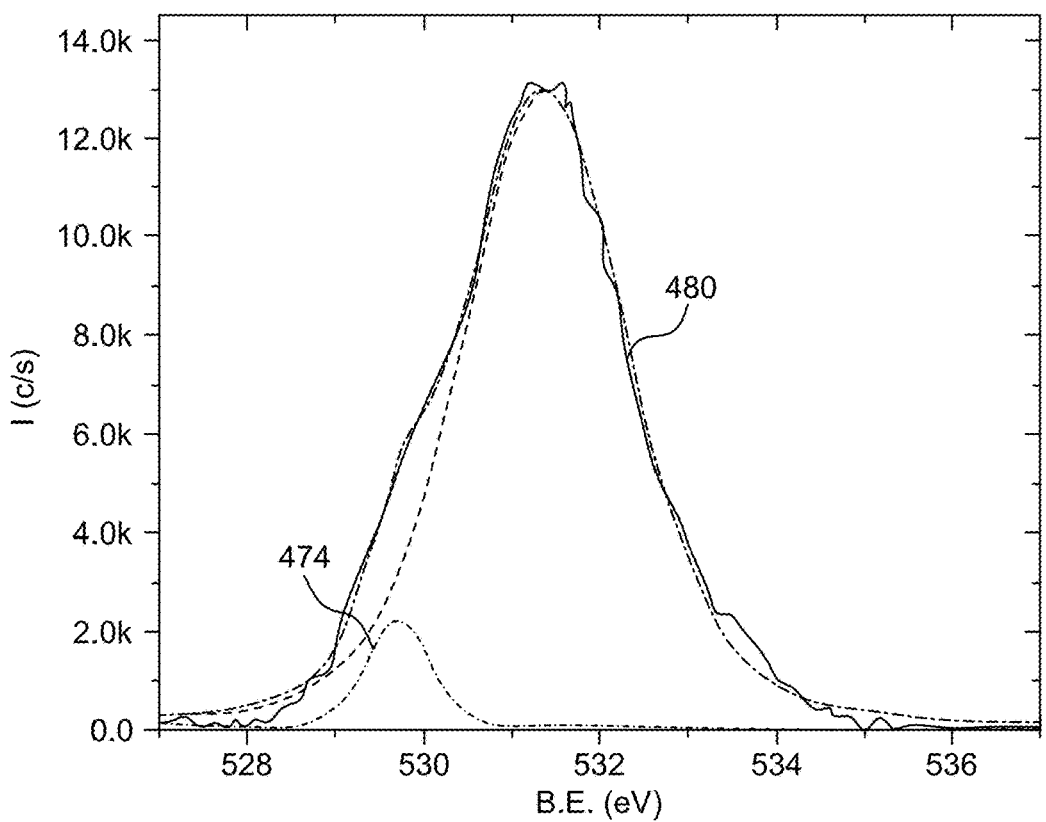
Figure 4I:
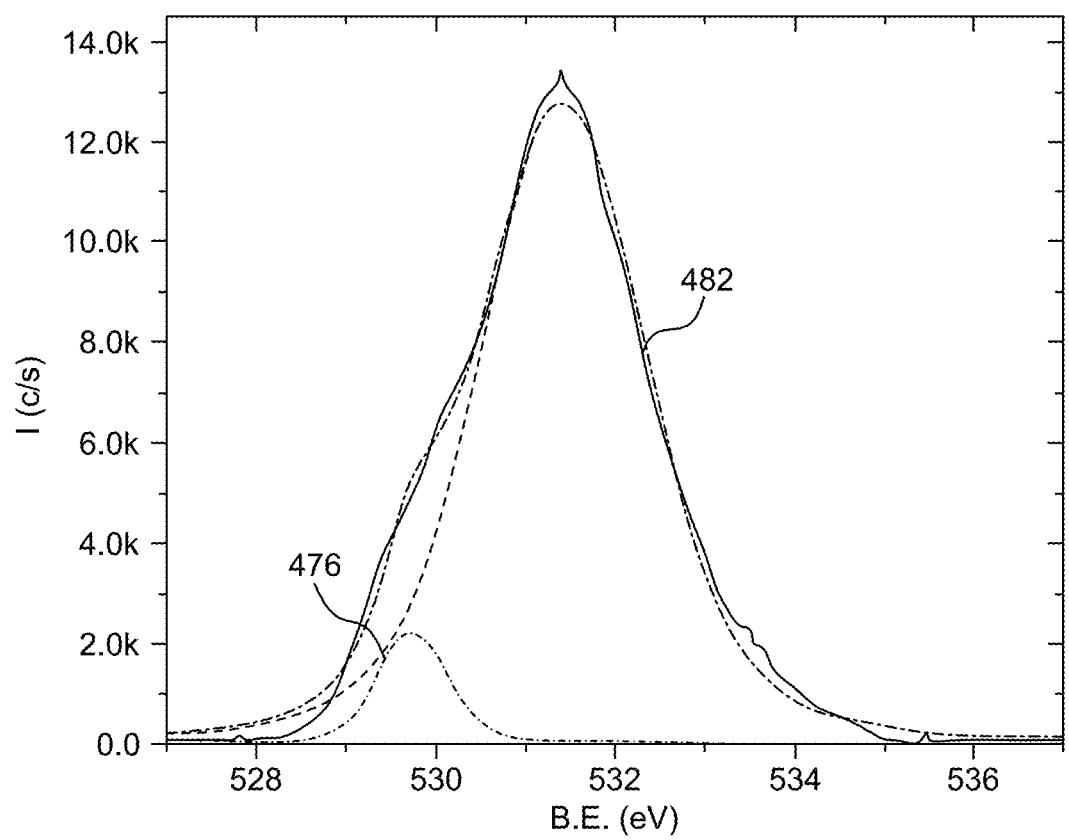

High-resolution XPS spectra of $O_1s$ for films S1, S2, and S3 are shown in FIGS. 4G-4I, respectively. For all films, the $O_1s$ peak is deconvoluted into two peaks using the peak fitting analysis: a small peak at 529.7±0.1 eV (472, 474, and 476) was due to $Cr_2O3$, and another peak at a binding energy of 531.5±0.1 eV (478, 480, and 482) was due to 0-H bond. The intensities of $Cr_2O_3$ and O—H peaks for the three films were within one sigma range of each other, indicating that the oxidation occurred during air exposure before introducing them to the XPS chamber. This sort of post-growth oxidation of nitride films was commonly observed when films were exposed to the atmosphere before performing an XPS study [Y. Yuan et al., Surf. Eng. 36, 411 (2020].

XPS analysis of films S1-S3 indicates doping of oxygen in the films; S1 has relatively less oxygen content than samples S2 and S3. Chromium was predominantly in a +3-oxidation state, forming CrN, as evident from the stronger CrN peak in FIG. 4; a small amount of $Cr^{+3}$ is also due to the formation of $Cr_2O_3$. A small amount of $Cr_2N$ was also present in the sample.

Figure 5:
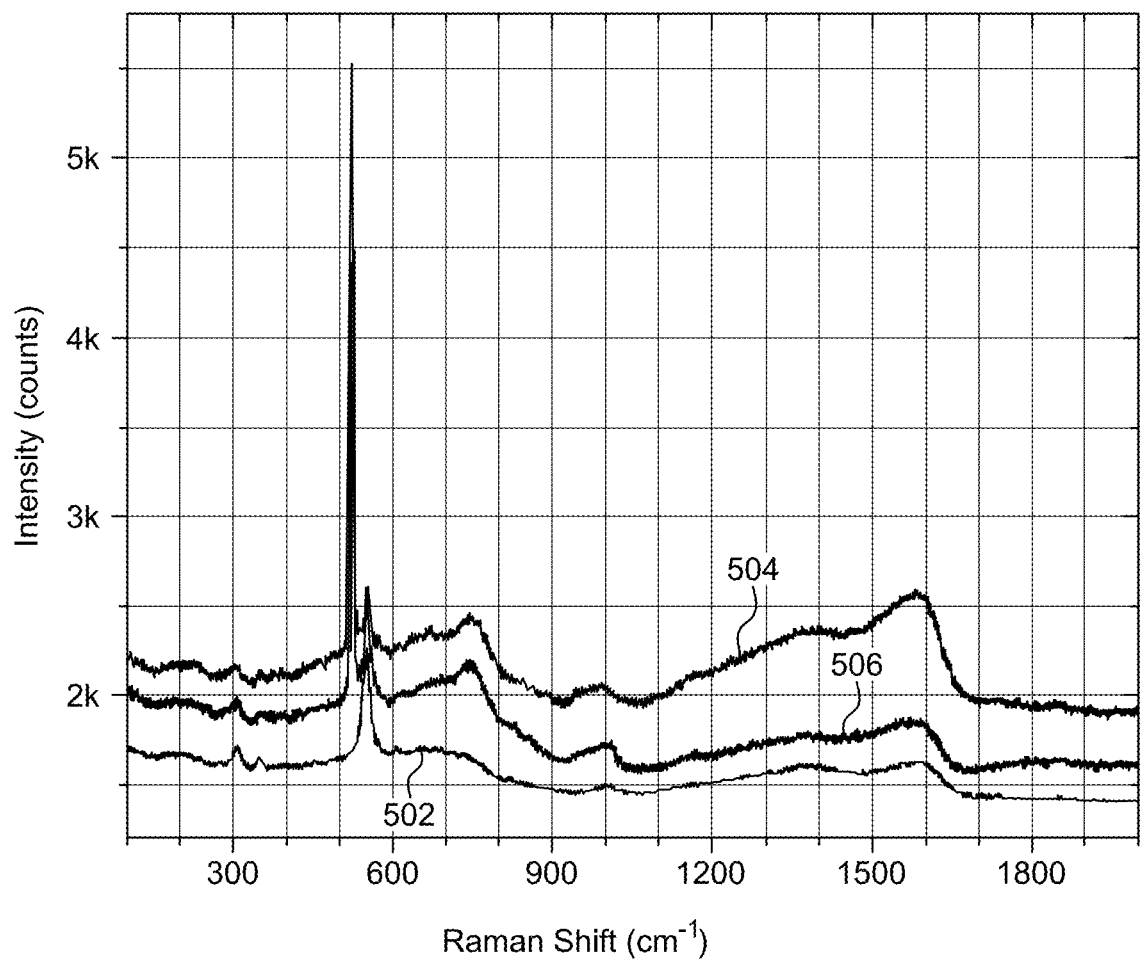
FIG. 5 shows Raman spectra for the S1/Si(100), S2/Si(100), and S3/Si(100) CrN thin films, according to certain embodiments.

Raman spectra between 100 and 2000 $cm^{-1}$ for the S1/Si(100), S2/Si(100), and S3/Si(100) CrN thin films, or S1 (502), S2 (504), and S3 (506) samples was shown in FIG. 5, where several peaks were observed. The peaks at 238, 308, 355, and 665 $cm^{-1}$ were related to CrN [A. Barata, L. Cunha, and C. Moura, Thin solid films 398, 501 (2001], but the peak at 665 $cm^{-1}$ could also be assigned to $Cr_2N$. $Cr_2O_3$ produced a peak at 555 $cm^{-1}$. Si substrate peaks were observed at 524 $cm^1$ in S2 and S3 samples [R. Kumar, H. Mavi, and A. Shukla, Silicon 2, 25 (2010]. Broad peaks at 1370 and 1590 $cm^{-1}$ were produced by the D-band and G-band of carbon, respectively. The carbon signal was commonly seen in samples exposed to air. These findings agree with the XPS results.

Figure 6A:
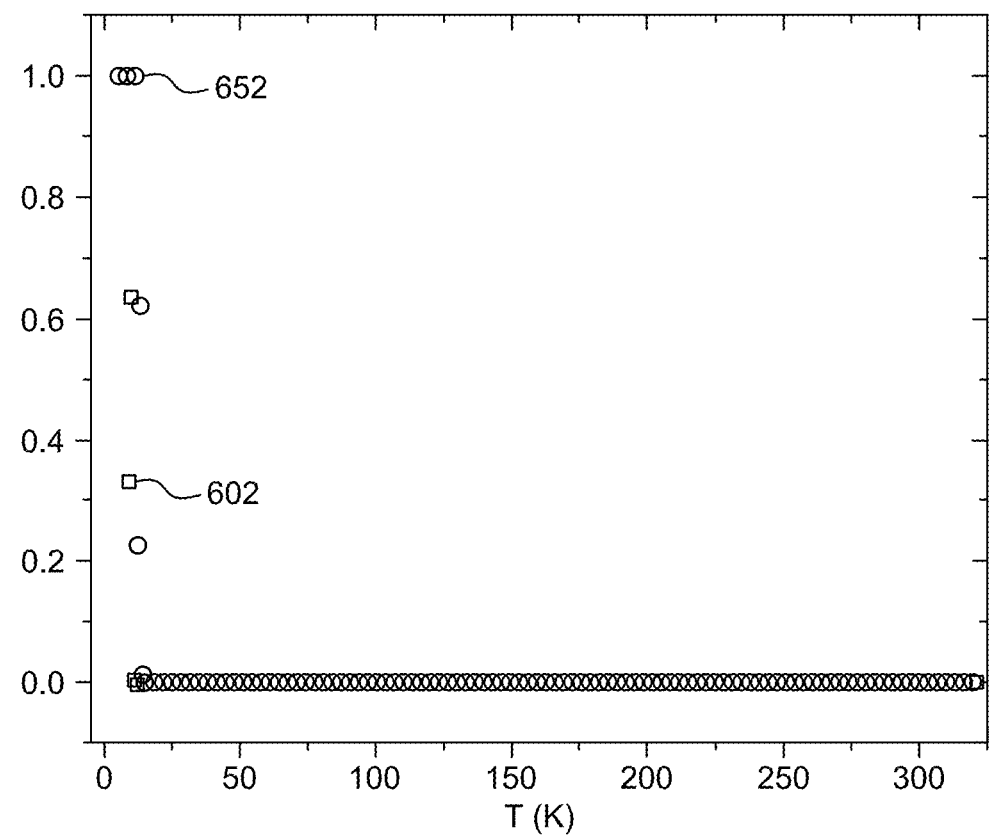
FIGS. 6A-6C show resistivity versus temperature plots for the S1/Si(100), S2/Si(100), and S3/Si(100) CrN thin films, respectively, according to certain embodiments.
Figure 6A:
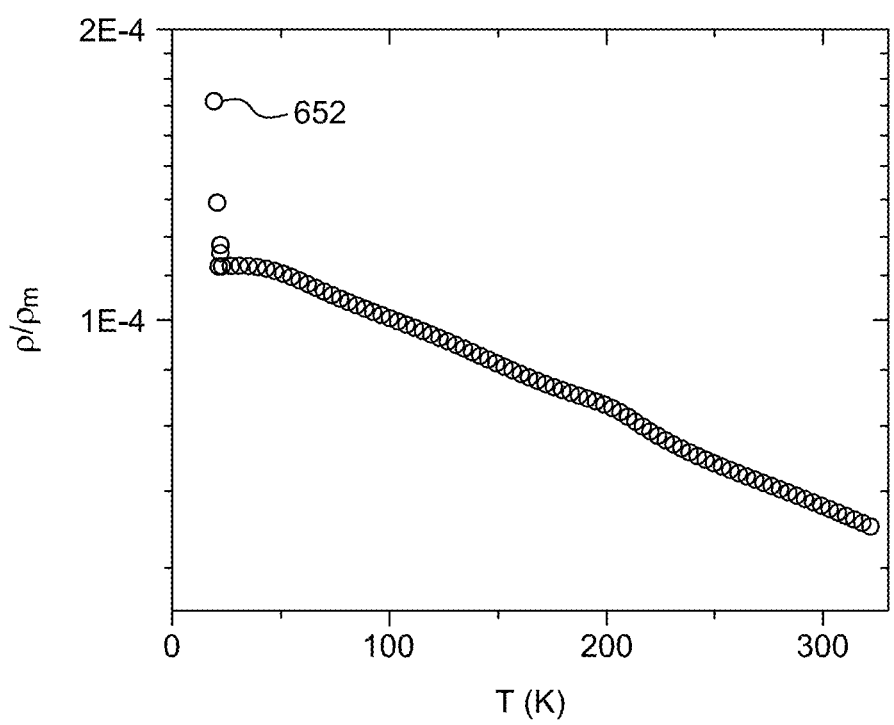
Figure 6B:
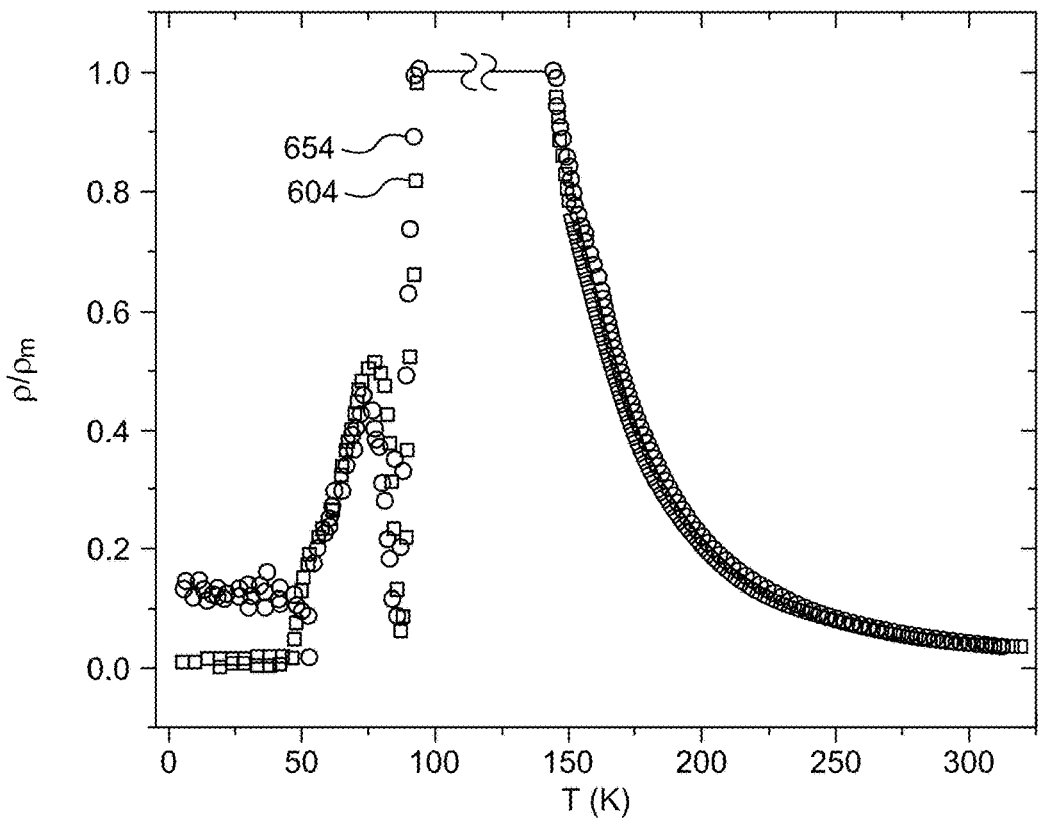
Figure 6C:
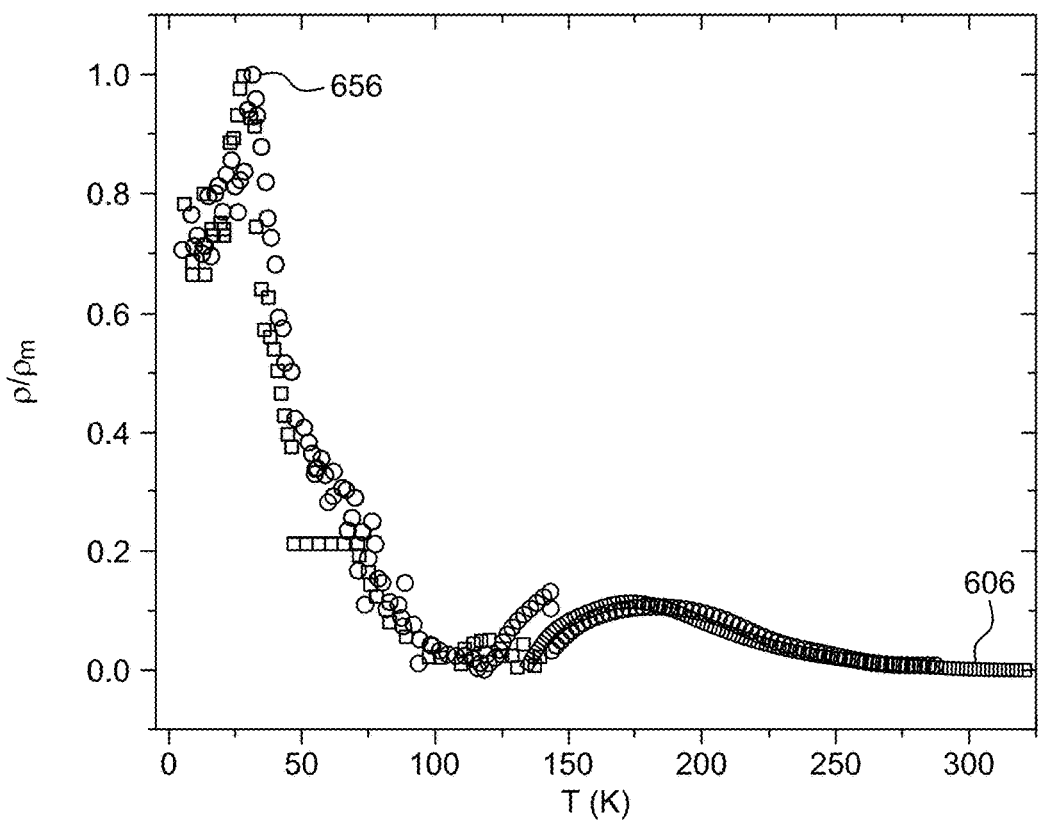

Resistivity versus temperature data sets for S1/Si(100), S2/Si(100), and S3/Si(100) or Si, S2, and S3, respectively, are shown in FIGS. 6A, 6B, and 6C, respectively. The ordinate shows the resistivity ratio $\rho/\rho_m$, where $\rho$ represents the film's resistivity at any temperature, and $\rho_m$, is the maximum resistivity of the film. The absolute temperature plotted on the abscissa covers a range from 4 K to 320 K. For all films, the squares (602, 604, and 606) represent the data sets when the film was cooling. The circles (652, 654, and 656) represent the data sets when the films were warming. The resistivity of S1, S2, and S3 at room temperature (RT) was $6.1\times10^{-5}$ $\Omega\cdot m$, $2.6\times10^{-2}$ $\Omega\cdot m$, and $2.3\times10^{-1}$ $\Omega\cdot m$, respectively, which were in the range of the values reported in the literature [D. Gall, C. Shin, R. Haasch, I. Petrov, and J. Greene, J. Appl. Phys. 91, 5882 (2002); M. E. McGahay and D. Gall, Appl. Phys. Lett. 114, 131602 (2019); P. Anderson et al., J. Appl. Phys. 98, 043903 (2005); A. Garzon-Fontecha, H. Castillo, E. Restrepo-Parra, and W. De La Cruz, Surf. Coat. Tech.334, 98 (2018); and M. A. Gharavi et al., J. Phys. D Appl. Phys. 51, 355302 (2018)]. In FIG. 6A, upon cooling film S1 from 320 K to 12 K, its resistivity appeared almost constant until 12 K, but at 12 K, the $\rho$ increased sharply to about $2.0\times10^6$ at 9 K. The $\rho/\rho_m$ versus temperature data for S1 while warming the film reproduced the same data as during cooling of the film from room temperature. The transition was off by 3K upon warming, mainly due to the thermal hysteresis commonly observed in such measurements. The inset in FIG. 6A shows a zoomed-in view of the $\rho/\rho_m$ plot from 15 K to 320 K while warming the film. The resistivity of S1 monotonically decreases at a rate of $1.89\times10^{-7}$/K from 15 K to 320 K, which indicates that the film is semiconducting in the temperature range from 320 K to 12 K. The results of film S1 are similar to the results the semiconducting behavior of CrN/MgO(001) reported by Gall el al., [D. Gall, C. Shin, R. Haasch, I. Petrov, and J. Greene, J. Appl. Phys. 91, 5882 (2002)] as the resistivity of samples increased by decreasing temperature. However, by cooling the samples from room temperature down to 20 K, the resistivity of Si increased only by 10 compared to $10^3$ for CrN/MgO(001), and electronic transition in S1 was much sharper than in CrN/MgO(001).

The resistivity of film S2, as shown in FIG. 6B, increased upon cooling from 320 K to 144 K at a much faster rate than S1. The observed behavior of S2 showed that the film was semi-conducting above 144 K. From 143 K to 94 K, the value of resistivity reached the resistivity setup limit. At temperatures below 94 K, the resistivity decreased sharply indicating that the film is metallic in nature below 94 K. A distinctive knee-like feature was observed around 75 K, which showed negative and positive slopes that indicate another metallic semiconducting transition. This feature could be due to a secondary phase such as CrOxNy in the film. The resistivity curve was reproduced by warming the film. The transition in these films from semiconducting to metallic phase agrees with Constantin et al.'s report on CrN/MgO(001) thin films [C. Constantin, M. B. Haider, D. Ingram, and A. R. Smith, Appl. Phys. Lett. 85, 6371 (2004).

The resistivity curve for S3 is shown in FIG. 6C. By cooling the film from room temperature, the resistivity increased slowly with the decrease in temperature and peaked around 175 K. Above 175 K, the resistivity had a negative slope indicating that the film is semiconducting, and below 175 K, the resistivity curve had a positive slope, which showed that the film is metallic. A similar saturation trend in the p versus T data was observed around 120 K for a 1:1 stoichiometric CrN/Si(111) [A. Garzon-Fontecha, H. Castillo, E. Restrepo-Parra, and W. De La Cruz, Surf. Coat. Tech. 334, 98 (2018)]. By cooling the film below 100 K, its resistivity increased at a faster rate and attained a maximum value of 29 K. The resistivity dropped below 29 K, which showed a transition from semiconducting to metallic phase. Film S3 was similar to film S2; both show semiconducting to metallic phase transitions, and both have two peaks in their resistivity curves. The results indicate that all films are semiconducting at room temperature and show electronic phase transition. The low-temperature phase depends on the growth conditions and hence the composition of the films.

The CrN thin films were prepared by reactive radio-frequency sputtering of Cr target in nitrogen and argon gases ambient. Films grown with the lowest nitrogen to argon flow rate ratio had the highest thickness and exhibited high crystallinity. Increasing the nitrogen to argon flow rate ratio resulted in amorphous films with smaller thicknesses. Moreover, the inclusion of oxygen in the films resulted in the $CrO_xN_y$ phase along with CrN. The XPS results revealed that the intensity of $CrO_xN_y$ increased with the increase in nitrogen/argon flow rate ratio. All the grown films exhibited an electronic phase transition from semiconducting to the metallic phase when cooled from room temperature down to 5K. There was a strong dependence on the nitrogen to argon flow rate ratio on the transition temperature of the films. Films with a higher nitrogen/argon ratio exhibited electronic phase transition at a higher temperature than those grown at a lower nitrogen/argon flow rate. The onset of the electronic transition at lower temperatures could be associated with oxygen doping. A bump in the resistivity versus temperature graph was observed for all the samples, and the bump's position also depended on the nitrogen/argon flow rate ratio. The bump could be due to the presence of $CrO_xN_y$ in the films.

Numerous modifications and variations of the present disclosure are possible in light of the above teachings. It is, therefore, to be understood that within the scope of the appended claims, the invention may be practiced otherwise than as specifically described herein.

The invention claimed is:
1. A low pressure closed chamber method for producing a chromium nitride thin film, comprising:
   reactive radio frequency magnetron sputtering chromium in a vacuum chamber onto a substrate in the presence of a gaseous mixture comprising nitrogen and argon to form the chromium nitride thin film, wherein:
   a ratio of the nitrogen gas to the argon gas is 1:2 to 1:10, the chromium nitride thin film has an average thickness of 500 to 1500 nm, the chromium is sputtered with a sputtering power of 120-150 W, a flow rate of the nitrogen gas is from 1 sccm to 4 sccm, a closed chamber pressure during the reactive radio frequency magnetron sputtering is from 1.50 to 1.95×10$^{-2}$ Torr, and the chromium nitride film grows in [111]CrN and [002] CrN directions by X-ray diffraction (XRD).

2. The method of claim 1, wherein the reactive radio frequency magnetron sputtering is carried out in the presence of oxygen and the chromium nitride thin film comprises a CrO$_x$N$_y$ phase.

3. The method of claim 1, wherein the ratio of the nitrogen gas to the argon gas is 1:2 to 1:4.

4. The method of claim 1, further comprising:
rotating the substrate during the reactive radio frequency magnetron sputtering.

5. The method of claim 1, wherein the chromium nitride thin film has a face centered cubic crystal structure.

6. The method of claim 1, wherein a surface of the chromium nitride thin film has cracks having a width of 2 to 30 nm.

7. The method of claim 1, wherein the chromium nitride thin film has an average thickness of 600 to 1300 nm.

8. The method of claim 1, wherein the chromium nitride thin film has an average thickness of 1100 to 1300 nm.

9. The method of claim 1, wherein the chromium nitride thin film has an average thickness of 600 to 700 nm.

10. The method of claim 1, wherein the chromium nitride thin film has a band gap of −0.2 eV to 1.2 eV.

11. The method of claim 1, wherein the chromium nitride thin film has a resistivity at 20 to 30° C. of 1×10$^{-5}$ Ω·m to 5×10$^{-1}$ Ω·m.

12. The method of claim 1, wherein the chromium nitride thin film has a resistivity at 20 to 30° C. of 4 to 10×10$^{-5}$ Ω·m.

13. The method of claim 1, wherein the chromium nitride thin film has a resistivity at 20 to 30° C. of 1 to 5×10$^{-1}$ Ω·m.

14. The method of claim 1, wherein the chromium nitride thin film is crystalline and has a face centered cubic structure.

15. The method of claim 1, wherein a surface of the chromium nitride thin film has pyramidal structures with the basal planes having either 60° or 90° corners.

* * * * *